United States Patent [19]

Yoon

[11] Patent Number: 5,681,419
[45] Date of Patent: Oct. 28, 1997

[54] REACTIVE ION ETCHING APPARATUS

[75] Inventor: Hak-Soon Yoon, Seoul, Rep. of Korea

[73] Assignee: Hyundai Electronics Industries Co., Ltd., Ich'on, Rep. of Korea

[21] Appl. No.: 579,139

[22] Filed: Dec. 27, 1995

[30] Foreign Application Priority Data

Dec. 28, 1994 [KR] Rep. of Korea ............... 37781/1994

[51] Int. Cl.$^6$ ............................................. H01L 21/302
[52] U.S. Cl. ...................... 156/345; 216/71; 118/723 E
[58] Field of Search ............................ 156/345, 643.1; 118/723 E; 204/298.14, 298.15, 298.39; 216/71; 315/111.21

[56] References Cited

U.S. PATENT DOCUMENTS

| | | | |
|---|---|---|---|
| 4,983,253 | 1/1991 | Wolfe et al. | 156/643 |
| 5,006,760 | 4/1991 | Drake, Jr. | 315/111.21 |
| 5,215,619 | 6/1993 | Cheng et al. | 156/345 |
| 5,443,689 | 8/1995 | Kimura et al. | 156/345 |

FOREIGN PATENT DOCUMENTS

| | | |
|---|---|---|
| 61-224423 | 6/1986 | Japan. |
| 63-024623 | 2/1988 | Japan. |
| 1-196827 | 8/1989 | Japan. |
| 3-138382 | 6/1991 | Japan. |

*Primary Examiner*—R. Bruce Breneman
*Assistant Examiner*—George Goudreau
*Attorney, Agent, or Firm*—Ware, Fressola, Van Der Sluys & Adolphson LLP

[57] ABSTRACT

A reactive ion etching apparatus comprises a reactive chamber, an upper anode plate, a lower cathode plate, a gas introducing system and a pumping system. The cathode plate is formed as a variable potential electrode. The variable potential electrode is a combination of a conductive material and a nonconductive material.

6 Claims, 5 Drawing Sheets

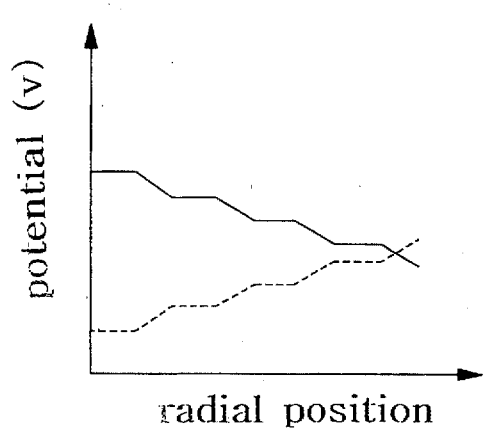
FIG. 9
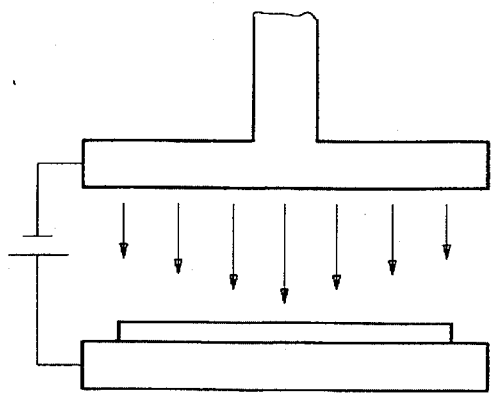      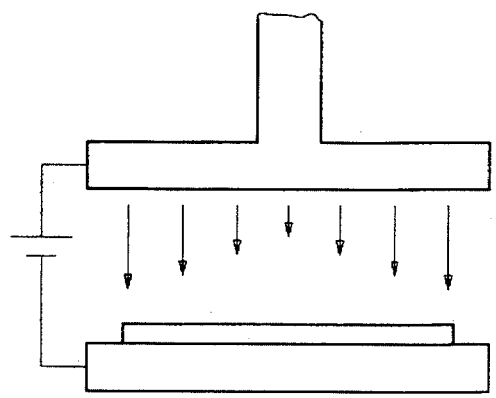
FIG. 10A            FIG. 10B

REACTIVE ION ETCHING APPARATUS

FIELD OF THE INVENTION

The present invention relates to parallel plate reactive ion etching, and in particular to increasing the uniformity of the etch rate.

BACKGROUND OF THE INVENTION

As the density of integration in IC fabrication becomes large, miniaturization of the patterns is required. The resolution of the wet etching technique is 3 µm. This relatively poor resolution is caused by isotropic etching.

Etching with little undercut can be accomplished by sputtering argon ions. In this method, however, the difference in etch rate of different materials—that is, selectivity—is small. Furthermore, the etch rate and substrate throughput are low, and damage by ion bombardment is large.

If plasma is formed in an active gas and the specimen is exposed to the plasma, the etching can be accomplished by a chemical reaction, and good selectivity and high etch rates can be expected. But active species (neutral radicals) participating in the etching are in random motion, and an isotropic etch occurs, resulting in undercutting. Consequently, the fabrication of micropatterns by this method is usually not acceptable.

A dry etching method has been developed that combines the advantages of the preceding two methods: good selectivity, little undercut, and high productivity. This method is called reactive ion etching, where the wafer surface is etched by bombarding ions on a predetermined object, such as a semiconductor wafer, the ions being ionized to a higher level of energy by a glow discharge between both electrodes to which a high voltage is applied.

The basic structure of a reactive ion etching apparatus is illustrated in FIG. 1. As shown in FIG. 1, in a parallel plate reactive ion etch (RIE) device, two plates, an upper plate electrode 2 and a lower plate electrode 3 (anode and cathode respectively) are disposed with a reactive chamber 1. The electrode 3 is placed in the lower part of the chamber, and the other electrode 2 is placed horizontally on the upper part of the chamber. One or more wafers, that are to be etched, are placed on the lower plate. A gas inlet introduces reactive gases, and a pumping system is used to maintain the pressure in the etching chamber constant. Rf power is applied to the electrodes. In this structure, ion etching starts when the lower and upper electrodes are charged by a predetermined applied voltage and a glow discharge occurs between both electrodes. The reactive etching is performed by forming a uniform electric field between both electrodes 2, 3, as shown in FIG. 1. However, in the prior art reactive ion etching apparatus, the etching rate is controlled by various factors. For instance, for making small patterns on the wafer, it is found impossible to avoid a difference in etch rate between the center section and the edge section of the wafer, even if the appropriate pressure of the reactive gas is properly selected and maintained. Therefore, when the end point of etching is selected based on the portions with a slow etch, the other portions of the wafer will be over-etched. On the other hand, if the end point of the etching is selected according to the portions with the fast etch, the other portions of the wafer will be under-etched.

One difficulty in the RIE process (or apparatus) is obtaining a uniform etch rate of a thin film on a batch of wafers placed on the cathode when the wafer has the above-described different etch rates as between the center section and the edge sections is the uniformity of the electric field formed across both electrodes 2, 3. Furthermore, it is preferable to avoid the drawbacks of nonuniform etching especially when the wafer increases in size. Unfortunately, the inevitable result of increased size wafers using the prior art approach is an even more nonuniform etch of the surface of the wafer.

DISCLOSURE OF INVENTION

In view of the foregoing, it is one object of this invention to provide a reactive ion etching apparatus which provides improved uniformity of the etch rate. The reactive ion etching apparatus has a chamber with a top conductive anode plate and a bottom cathode plate. The wafers to be etched are placed on the bottom plate, which is also coupled to a power supply. A gas is introduced through a port in the chamber to provide a reactive species which bombard and etch the wafer in a desired pattern.

Uniformity of etch rate is provided by forming at least one electrode, cathode or anode, as a variable potential electrode. The variable potential electrode is a combination of a conductive material and a nonconductive material. The structure of the variable potential electrode is such that the conductive material surrounds the outside of the nonconductive material, and also exists at the center of nonconductive material.

In addition, an alternate structure of the variable potential electrode includes a combination of a conductive material and a nonconductive material, wherein both materials are alternatively placed in a repeated fashion, and thus forming a structure with multiple ring-shaped layers that alternate between conductive and nonconductive materials. It is preferable to have at least three layers of nonconductive material. Furthermore, it is preferable that the layers of both materials increase in thickness from the center to the circumference resulting in the outermost ring-shaped layer being the thickest in width and the innermost ring-shaped layer being the thinnest in width. Alternatively, it is also preferable that the layers of the nonconductive material increase in thickness from the center to the circumference resulting in the outermost ring-shaped layer being the thickest in width and the innermost ring-shaped layer being the thinnest in width.

In another case, the variable potential electrode includes a multi-layered structure in which a ceramic layer, an insulating layer, and a variable potential layer are laminated sequentially. Here, the variable potential layer is a combination of a conductive material and a nonconductive material. The structure of the variable potential layer is formed such that the conductive material surrounds the outside of nonconductive material, and also exists at the center of the nonconductive material.

An alternative structure of the variable potential layer includes a combination of a conductive material and a nonconductive material, herein both materials are alternately placed in a repeated fashion, and thus forming a structure with multiple ring-shaped layers that alternate between conductive and nonconductive materials.

Furthermore, it is preferable that the layers of both materials increase in thickness from the center to the circumference resulting in the outermost ring-shaped layer being the thickest in width and the innermost ring-shaped layer being the thinnest in width.

Alternatively, it is also preferable that the layers of the nonconductive material increase in thickness from the center to the circumference resulting in the outermost ring-shaped layer being the thickest in width and the innermost ring-shaped layer being the thinnest in width.

In all of the structures for a variable potential electrode, the high radio frequency voltage across both electrodes is finely controlled according to the position from the center of the wafer to the circumference. Thus, the voltage gradually drops or rises as distance away from the center changes, according to the direction of the applied voltage to the center section and the edge sections. The voltage difference matches the etch rate of the wafer near the edges of the electrode which was originally higher that the etch rate near the center of the electrode. This compensation results in a very uniform rate of etch of the thin film on all wafers on the lower plate.

These and other objects, features and advantages of the present invention will become more apparent in light of the detailed description of a best mode embodiment thereof, as illustrated in the accompanying drawing.

BRIEF DESCRIPTION OF THE DRAWING

FIG. 9 is a graph showing the potential difference in accordance with the radial position of the variable potential electrode, according to the present invention; and FIG. 10A and FIG. 10B are sectional views showing the electric field distribution state in accordance with the bias connection of the present invention.

BEST MODE FOR CARRYING OUT THE INVENTION

Figure 1:
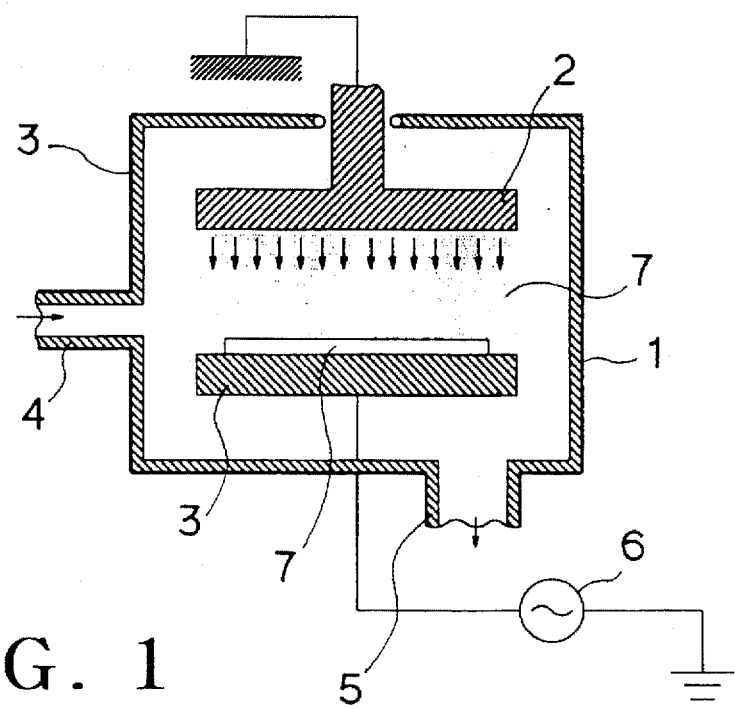
FIG. 1 is a sectional view showing the basic structure of the reactive ion etching apparatus and the electric field state in a conventional reactive ion etching process.

Referring now to the drawing wherein similar elements are designated with identical numerals throughout the several views, preferred embodiments of the present invention are shown in FIG. 2 to FIG. 10B. The inventor noticed that if the voltage, which greatly influences the etch rate of reactive ion etching, is controlled at each position of the wafer, the nonuniformity problem of reactive ion etching can be resolved. In all embodiments, the structure of the electrode is formed such that the voltage across both electrodes gradually changes corresponding to the distance away from the center of the electrode.

Figure 2:
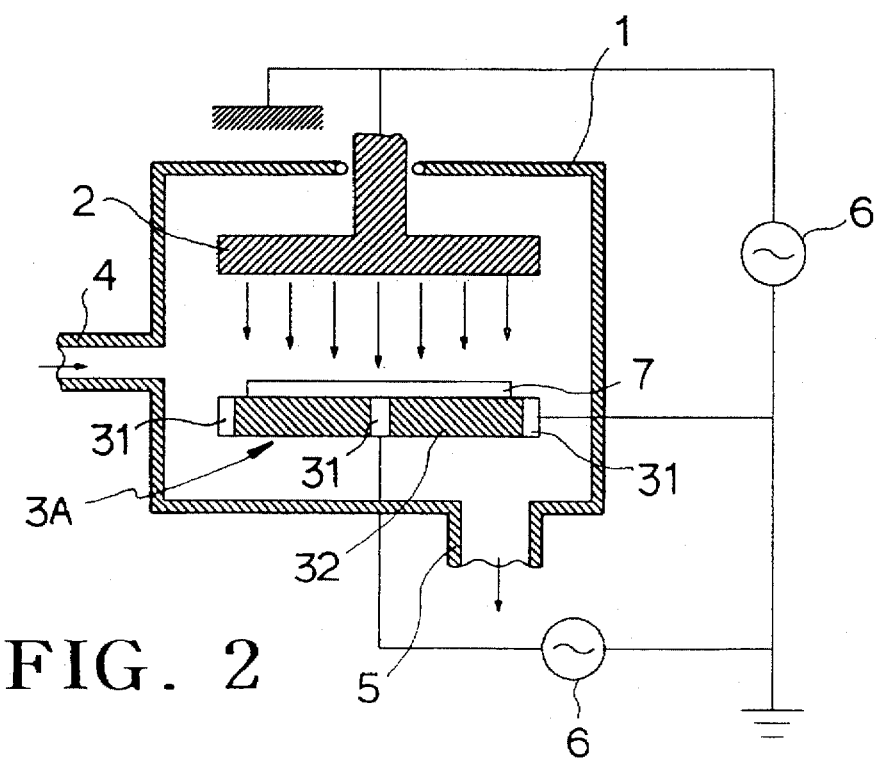
FIG. 2 is a sectional view of a first embodiment of the present invention, showing the basic structure of the reactive ion etching apparatus and the electric field state in reactive ion etching process according to the present invention.

First, the principal structure of a reactive ion etching apparatus as the first embodiment of the invention is shown in FIG. 2. In FIG. 2, the reactive ion etching apparatus is comprised of a reactive chamber 1, an upper anode plate 2, a lower cathode plate 3A, a gas introducing system 4 and a pumping system 5. The anode plate 2 and cathode plate 3A are disposed opposite to each other at a regular distance. Cathode plate 3A is coupled to a radio frequency (RF) source 6. The anode plate 2 is coupled to the chamber wall which in turn is grounded, and thus grounding the upper plate 2 with respect to the RF source 6.

A plurality of semiconductor wafers 7 are disposed on lower plate 3A such that one flat surface of each wafer is contacting lower plate 3A and the other flat surface, the surface to be etched, of each wafer is facing upper plate 2. In one embodiment, polysilicon wafers are used. A typical process uses a layer of masking material, photoresist, which is coated on the wafer on which the polysilicon layer of approximately 4500 angstrom has been deposited. Patterns are produced in the photoresist layer by a photographic process. The photoresist left behind protects certain regions of the thin film from etching in the RIE. The photoresist is removed later in acid, leaving behind non-etched regions of the polysilicon. A process gas which is used to generate the chemically reactive species, such as $CF_4$ and $SiCl_4$ for polysilicon wafer etching is introduced to the chamber 1 through gas introducing system 4. A pumping system 5 coupled to the chamber i is used to maintain the pressure in the etching chamber constant. When RF power at 13.6 MHz and about 900 volt peak to peak is applied to the bottom plate 3A in the presence of the gas, the gas is induced to release reactive species, such as fluorine from $CF_4$ and chlorine from $SiCl_4$. The reactive species bombard the wafers, etching the wafers in an anisotropic manner.

In the RIE apparatus of FIG. 2, the cathode plate 3A is formed as a variable potential electrode. The variable potential electrode is a combination of a conductive material and a nonconductive material. In the present invention, a "variable potential electrode" is defined as an electrode in which the voltage at each position thereof is varied. The structure of the variable potential electrode 3A is formed such that the conductive material 31 surrounds the outside of circular nonconductive material 32, and also exists at the center of nonconductive material 31, as shown in FIG. 2. The conductive material 31 includes metallic material.

If a RF power is applied to between the center and the edge sections of the above cathode plate 3A, a voltage gradient occurs in between the center and the edge sections of the cathode plate 3A. A voltage difference thus occurs in the direction from the center to the edge of the wafer 7 which is placed on the cathode plate 3A. Consequently, the etch rate, which is proportional to the voltage, changes.

Therefore, if a difference in the etch rate at the center section and the edge sections of the wafer occurs, the voltage between the anode plate 2 and the cathode plate 3A can be controlled so that the higher voltage is applied to the section with the low etch rate and the lower potential voltage is applied to the section with the high etch rate, based on the position on the wafer 7. If the voltage between the anode plate 2 and the cathode plate 3A changes at each position, the amount of etching at each position is thereby varied to compensate for the differences in etching depths. Since the potential voltage shown in FIG. 3 is added to the equipotential voltage generated by the conventional ceramic cathode, all the voltage difference between the anode and the multilayer cathode increases by the bias voltage applied between the center section and the edge section of the variable potential layer.

Figure 3:
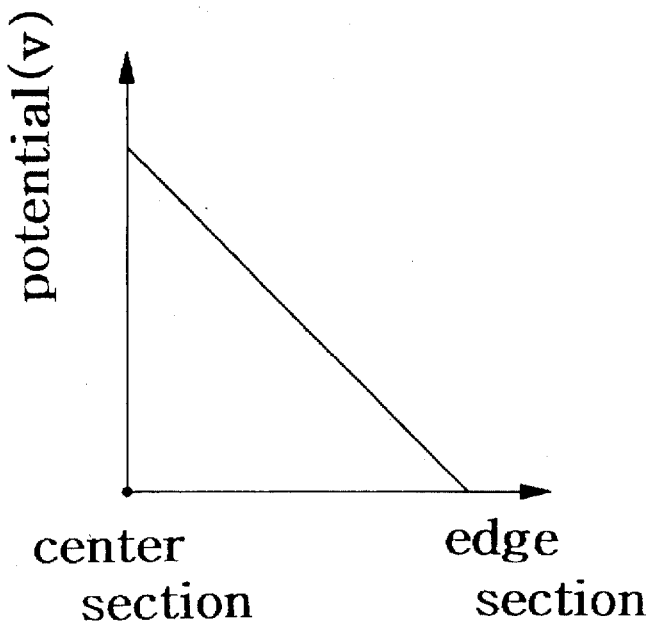
FIG. 3 is a graph showing an example of a change of potential voltage across the distance from the center section of the cathode, according to the present invention, where the potential voltage is on the vertical axis and the distance from the center section of the cathode is on the horizontal axis.

For example, when deeper etching occurs at the edges of the wafer than at the center of the wafer, the variable potential electrode is formed such that the voltage across both electrodes drops as distance away from the center increases (refer to FIG. 3). Because the etch rate in the reactive ion etching is proportional to the voltage across both electrodes the deeper etching at the edges is lessened. On the other hand, when etching occurs more deeply at the center sections of the wafer than at the edge sections of the wafer, the etch rate near the edge sections of the wafer can be enhanced by changing only the polarity of the bias voltage between the center section and the edge sections applied to the variable potential electrode 3A. Accordingly, if the difference in etch rate occurs between the center section and edge sections of the wafer, the nonuniformity of the surface of the wafer can be resolved simply by control of the voltage across both electrodes at each position of the wafer.

Figure 4:
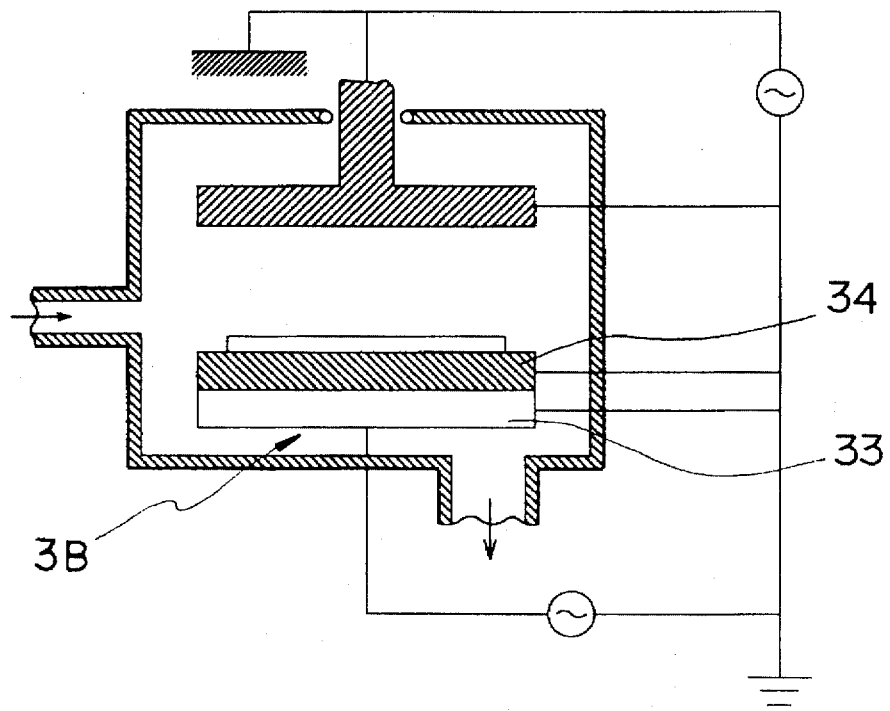
FIG. 4 is a sectional view of a second embodiment of the present invention, showing a basic structure of a reactive ion etching apparatus according to the present invention.
Figure 5:
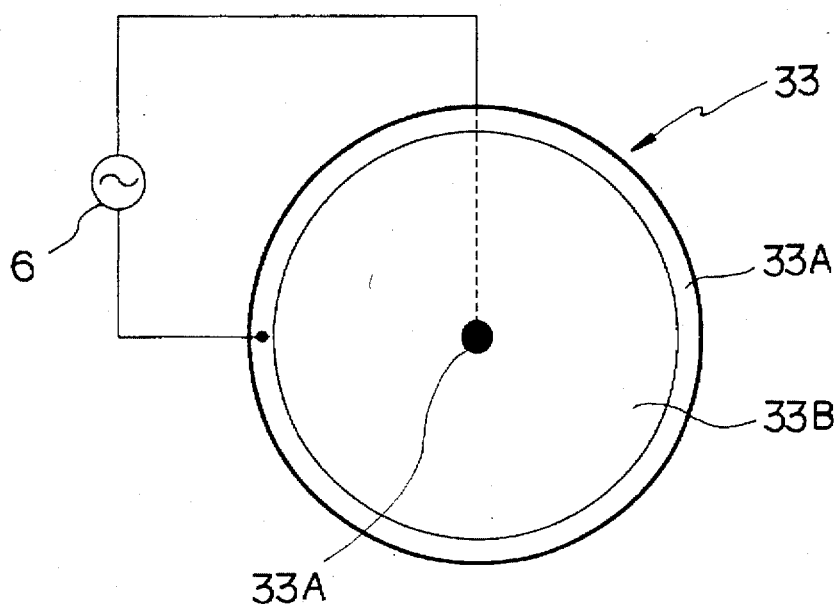
FIG. 5 is a plan view of a structure of a variable potential electrode according to the present invention and a bias connection state of a variable potential electrode.

As described above, the nonuniformity problem generated in the conventional reactive ion etching process due to a difference in the etch rate between the center section and the edge section is resolved by the present invention. Therefore, the throughput of the wafer is enhanced. FIG. 4 shows a second embodiment of the present invention. In the second embodiment, a variable potential electrode, a cathode plate 3B, includes a multi-layered structure in which a variable potential layer 33, and a nonconductive layer 34 are laminated sequentially. The variable potential layer 33 can also be a combination of a conductive material and a nonconductive material. The structure of the variable potential layer 33 of FIG. 4 is shown in FIG. 5 wherein the conductive material 33A surrounds the outside edge of a disk 33B of nonconductive material, and also exists at the center of the disk 33B of nonconductive material.

Figure 6:
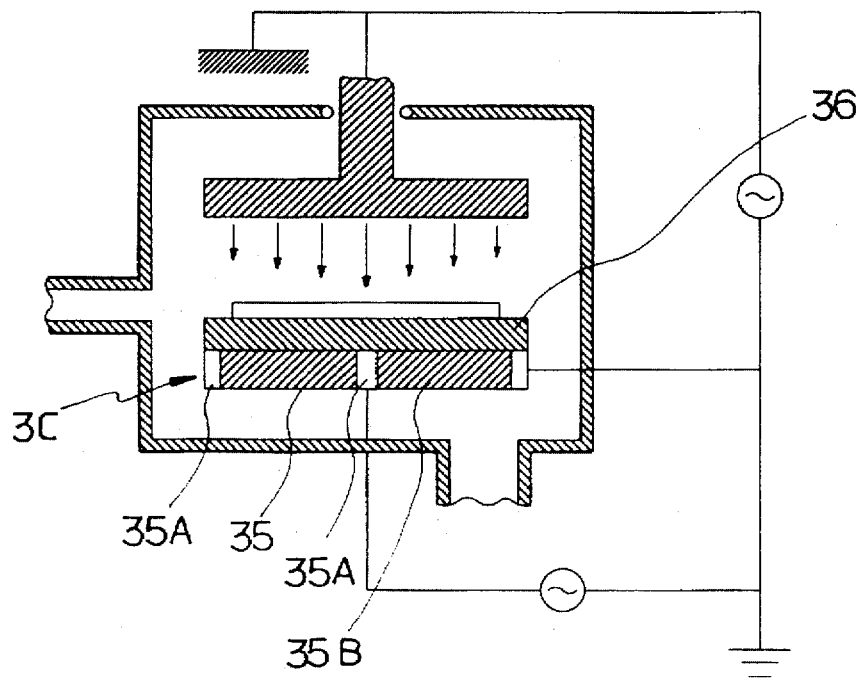
FIG. 6 is a sectional view of the second embodiment of the present invention, showing the basic structure of the reactive ion etching apparatus and the electric field state in a reactive ion etching process according to the present invention.

In addition, FIG. 6 shows a third embodiment of the present invention. The reactive ion etching apparatus includes an alternative structure of the variable potential electrode 3C. In the third embodiment, a variable potential electrode, in the form of a cathode plate 3C, includes a multi-layered structure in which a variable potential layer 35, and a nonconductive layer 36 are laminated sequentially.

The variable potential layer 35 can also be a combination of a conductive material and a nonconductive material. Describing the structure of the variable potential layer 35 shown in FIG. 6, the conductive material 35A surrounds the outside of nonconductive material 35B, and also exists at the center of nonconductive material 35B.

In addition, the anode can, of course be formed as a variable potential electrode according to the structure of the cathode described in accordance with the first, second, and third embodiments including all described variations, additions, and modifications. Likewise, all the effects resulting from the cathode as a variable potential electrode can also be similarly applied to the anode as a variable potential electrode.

Figure 7:
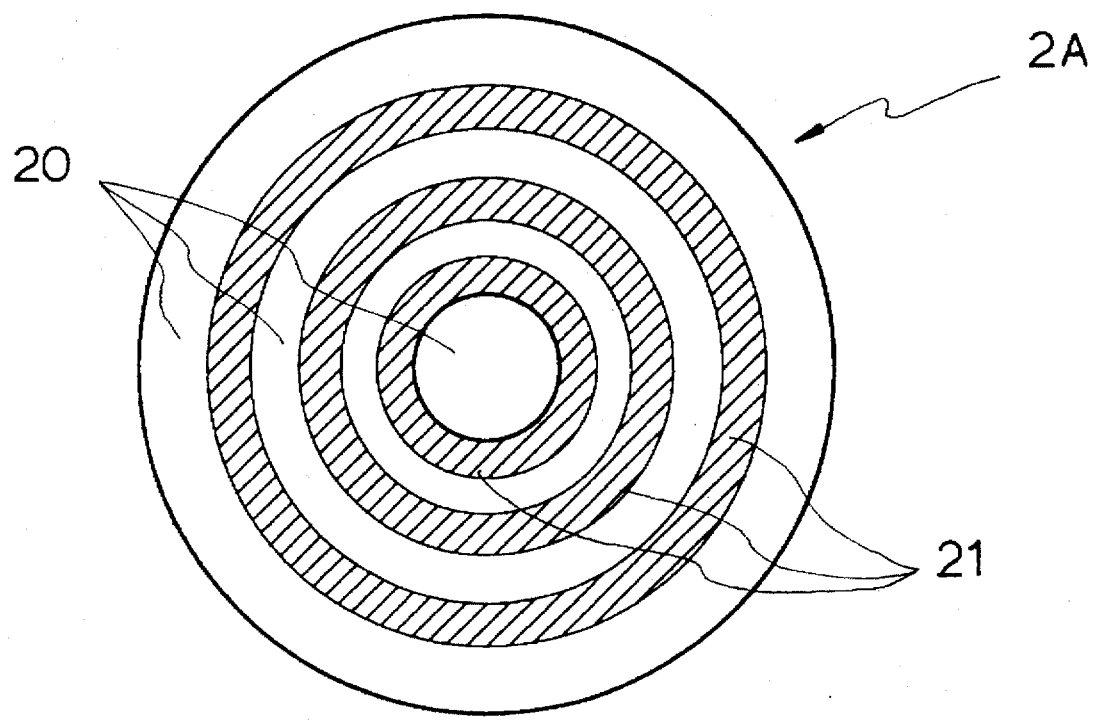
FIG. 7 is a plan view showing the structure of a variable potential electrode which shows a characteristic portion of a third embodiment of the present invention.
Figure 8:
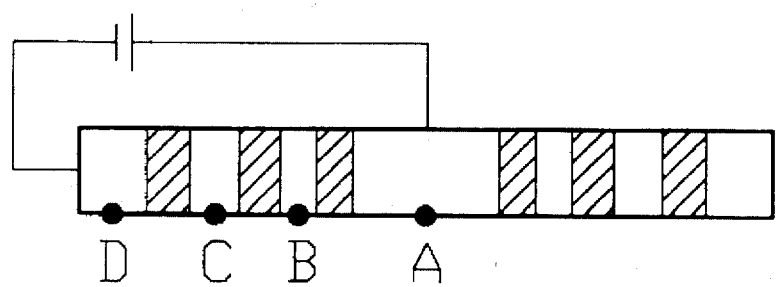
FIG. 8 is a cross-sectional view showing the structure of a variable potential electrode which shows the characteristic portion of the third embodiment of the present invention including the bias connection.

FIG. 7 to FIG. 9 shows a fourth embodiment of the present invention. In this embodiment, the anode plate is made as a variable potential electrode. The structure of the variable potential electrode 2A is shown in FIG. 7. The variable potential electrode 2A includes a combination of a conductive material 20 and a nonconductive material 21, wherein both materials 20 and 21 are alternately placed in a repeated fashion, and thus forming a structure with multiple ring-shaped layers that alternate between conductive and nonconductive materials. It is preferable to have at least three layers of nonconductive material 21. The reason is that as the number of alternate layers is increased, the control of the potential voltage becomes more fine. Furthermore, it is preferable that the layers of the nonconductive material 21 increase in thickness from the center to the circumference resulting in the outermost ring-shaped layer being the thickest in width and the innermost ring-shaped layer being the thinnest in width.

As shown in FIG. 8, the anode plate 2A is constructed such that the difference in voltage changes as the position of the anode 2A changes from the center to the circumference, by adopting the structure of the variable potential electrode that alternates between conductive material 20 and the nonconductive material 21. The voltage magnitude at each position of the variable potential electrode is A>B>C>D as shown in FIG. 8. Accordingly, in the anode of FIG. 7 the voltage drops from center to circumference.

In FIG. 9, the voltage is dropped from the center to edge sections of the anode plate 2A in the solid line, and the potential voltage is raised from the center to edge sections of the anode plate 2A in the dashed line. Either way may be selected according to the direction of the applied voltage. In accordance with such a continuously alternating arrangement of the conductive material and the nonconductive material with a prescribed thickness, the voltage of the anode is controlled. In the resultant controlled electric field, the etch rate of the wafer placed on the anode is controlled.

Additionally, it is preferable to have at least three layers of nonconductive material. The reason is that as the number of alternate layers is increased, the control of the voltage becomes finer.

Furthermore, it is preferable that the layers of the nonconductive material increase in thickness from the center to the circumference resulting in the outermost ring-shaped layer being the thickest in width and the innermost ring-shaped layer being the thinnest in width.

FIGS. 10A and 10B show the functional effect of the present invention. FIG. 10A shows the voltage between the cathode and the anode when the voltage of the center section is set at a high level. In accordance with the above-mentioned method, the etch rate of the center section can thus be raised. But if the polarity of the bias voltage is reversely applied, the reverse phenomenon occurs as shown in FIG. 10B.

In this case, because at the edge sections, the voltage is higher, the etch rate at these sections becomes higher as well. The opposite cases shown in FIGS. 10A and 10B are generated simply by changing the polarity of the applied voltage.

Additionally, the cathode can be formed as a variable potential electrode according to the structure of the anode described in accordance with the fourth embodiment including all described variations, additions, and modifications. Likewise, all the effects resulting from the anode as a variable potential electrode can also be similarly applied to the cathode as a variable potential electrode.

The anode can, of course, be formed as a variable potential electrode according to the structure of the cathode described in accordance with the first, second and third embodiments including all described variations, additions, and modifications. Likewise, all the effects resulting from the cathode as a variable potential electrode can also be similarly applied to the anode as a variable potential electrode.

Based on the magnitude and the direction of the applied voltage, and the contact position of the electrode, the desired voltage difference is selected. Thus, the desired voltage can be obtained. Therefore, by using the above mentioned methods, the uniformity of the wafer is greatly improved.

The etching rate of the reactive ion etching process increases proportionally with the difference in the above voltage. This method described above makes it possible to achieve various voltage differences between the center section and edge sections simply by changing the bias voltage and the biasing direction. The voltage, which is an important parameter of the reactive ion etching process, can therefore be easily controlled so that the overall surface of the wafer may be uniformly etched.

It will be apparent, of course, that many modifications may be made in the above-described embodiments without departing from the scope of the invention, which is defined by the claims below:

What is claimed is:

1. A reactive ion etching apparatus comprising:
   a chamber;
   a first electrode in said chamber for holding the substrate to be etched;
   a second electrode in said chamber, parallel to said first electrode;
   means for generating a plasma in said chamber;
   means coupled to the first electrode for providing electric power to the first electrode; wherein at least one of said electrode is a variable potential electrode including a combination of a conductive material and a nonconductive material which are alternately placed in a repeated fashion, thereby forming a disc structure with multiple ring-shaped layers that alternate between said conductive and nonconductive materials, said ring-shaped layers increasing in radial thickness from a center to a circumference of said disc structure, resulting in a radially thickest outermost ring-shaped layer and a radially thinnest innermost ring-shaped layer.

2. The reactive ion etching apparatus of claim 1 wherein the first electrode is said variable potential electrode.

3. The reactive ion etching apparatus of claim 1 wherein the second electrode is said variable potential electrode.

4. The reactive ion etching apparatus of claim 1 wherein there are at least three ring-shaped layers of said nonconductive material.

5. The reactive ion etching apparatus of claim 1 wherein a ring-shaped layer of said conductive material surrounds an outermost ring-shaped layer of the nonconductive material, and wherein the conductive material also exists in a center cavity of an innermost ring-shaped layer of the nonconductive material.

6. The reactive ion etching apparatus of claim 4 wherein said at least three ring-shaped layers of said nonconductive material increase in said radial thickness from said center to said circumference of the disc structure, resulting in said radially thickest outermost ring-shaped layer and said radially thinnest innermost ring-shaped layer comprising said nonconductive material.

* * * * *

UNITED STATES PATENT AND TRADEMARK OFFICE
CERTIFICATE OF CORRECTION

PATENT NO. : 5,681,419
DATED : October 28, 1997
INVENTOR(S) : Yoon

It is certified that error appears in the above-identified patent and that said Letters Patent is hereby corrected as shown below:

Column 4, line 34 replace "chamber i" with --chamber 1--

Signed and Sealed this

Fifteenth Day of June, 1999

Attest:

Q. TODD DICKINSON

Attesting Officer    Acting Commissioner of Patents and Trademarks